(12) United States Patent
Drake et al.

(10) Patent No.: US 10,643,903 B2
(45) Date of Patent: May 5, 2020

(54) MODE CONVERTER AND METHOD OF FABRICATING THEREOF

(71) Applicant: ROCKLEY PHOTONICS LIMITED, London (GB)

(72) Inventors: John Drake, St. Ives (GB); Damiana Lerose, Pasadena, CA (US); Henri Nykänen, Helsinki (FI)

(73) Assignee: Rockley Photonics Limited, London (GB)

( * ) Notice: Subject to any disclaimer, the term of this patent is extended or adjusted under 35 U.S.C. 154(b) by 0 days.

(21) Appl. No.: 16/317,151

(22) PCT Filed: Jul. 13, 2017

(86) PCT No.: PCT/GB2017/052065
§ 371 (c)(1),
(2) Date: Jan. 11, 2019

(87) PCT Pub. No.: WO2018/011587
PCT Pub. Date: Jan. 18, 2018

(65) Prior Publication Data
US 2019/0243070 A1 Aug. 8, 2019

Related U.S. Application Data

(60) Provisional application No. 62/362,012, filed on Jul. 13, 2016.

(51) Int. Cl.
H01L 21/8238 (2006.01)
G02B 6/136 (2006.01)
(Continued)

(52) U.S. Cl.
CPC ........ H01L 21/823821 (2013.01); G02B 6/12 (2013.01); G02B 6/131 (2013.01);
(Continued)

(58) Field of Classification Search
None
See application file for complete search history.

(56) References Cited

U.S. PATENT DOCUMENTS 5,787,214 A    7/1998  Harpin et al.
6,013,936 A *  1/2000  Colt, Jr. ............. H01L 21/7624
                                                      257/345
(Continued)

OTHER PUBLICATIONS

International Search Report and Written Opinion of the International Searching Authority, dated Oct. 17, 2017, Corresponding to PCT/GB2017/052065, 16 pages.

(Continued)

Primary Examiner — Jerry Rahll
(74) Attorney, Agent, or Firm — Lewis Roca Rothgerber Christie LLP

(57) ABSTRACT

An optical mode converter and method of fabricating the same from wafer including a double silicon-on-insulator layer structure. The method comprising: providing a first mask over a portion of a device layer of the DSOI layer structure; etching an unmasked portion of the device layer down to at least an upper buried oxide layer, to provide a cavity; etching a first isolation trench and a second isolation trench into a mode converter layer, the mode converter layer being: on an opposite side of the upper buried oxide layer to the device layer and between the upper buried oxide layer and a lower buried oxide layer, the lower buried oxide layer being above a substrate; wherein the first isolation trench and the second isolation trench define a tapered waveguide; filling the first isolation trench and the second isolation trench with an insulating material, so as to optically isolate the tapered waveguide from the remaining mode converter layer; and regrowing the etched region of the device layer.

20 Claims, 13 Drawing Sheets

(51) Int. Cl.
*G02B 6/13* (2006.01)
*H01L 21/8258* (2006.01)
*G02B 6/12* (2006.01)
*G02B 6/30* (2006.01)
G02B 6/42 (2006.01)
G02B 6/122 (2006.01)
H01L 21/762 (2006.01)
G02B 6/132 (2006.01)
G02B 6/134 (2006.01)
H01S 5/02 (2006.01)

(52) U.S. Cl.
CPC ............ *G02B 6/136* (2013.01); *G02B 6/305* (2013.01); *H01L 21/8258* (2013.01); G02B 6/12004 (2013.01); G02B 6/1223 (2013.01); G02B 6/132 (2013.01); G02B 6/1347 (2013.01); G02B 6/42 (2013.01); G02B 2006/121 (2013.01); G02B 2006/12038 (2013.01); G02B 2006/12061 (2013.01); G02B 2006/12097 (2013.01); G02B 2006/12147 (2013.01); G02B 2006/12152 (2013.01); G02B 2006/12176 (2013.01); G02B 2006/12178 (2013.01); G02B 2006/12195 (2013.01); H01L 21/7624 (2013.01); H01L 21/76224 (2013.01); H01L 21/76264 (2013.01); H01S 5/021 (2013.01); H01S 5/0216 (2013.01)

(56) References Cited

U.S. PATENT DOCUMENTS

| | | | |
|---|---|---|---|
| 6,108,478 A | 8/2000 | Harpin et al. | |
| 6,231,771 B1 | 5/2001 | Drake | |
| 6,509,139 B1* | 1/2003 | Roberts | G02B 6/13 385/131 |
| 6,556,759 B2 | 4/2003 | Roberts et al. | |
| 7,469,084 B2 | 12/2008 | Aalto | |
| 8,000,565 B2 | 8/2011 | Liu | |
| 2002/0131747 A1* | 9/2002 | Roberts | G02B 6/1228 385/132 |
| 2015/0293299 A1 | 10/2015 | Xu et al. | |
| 2016/0377806 A1 | 12/2016 | Ellis-Monaghan et al. | |

OTHER PUBLICATIONS

U.K. Intellectual Property Office Examination Report, dated Jul. 26, 2018, for Patent Application No. GB1711258.2, 7 pages.
U.K. Intellectual Property Office Examination Report, dated Dec. 12, 2018, for Patent Application No. GB1711258.2, 7 pages.
U.K. Intellectual Property Office Examination Report, dated Jun. 20, 2019, for Patent Application No. GB1711258.2, 3 pages.
U.K. Intellectual Property Office Search Report, dated Jul. 25, 2017, for Patent Application No. GB1711258.2, 3 pages.

* cited by examiner

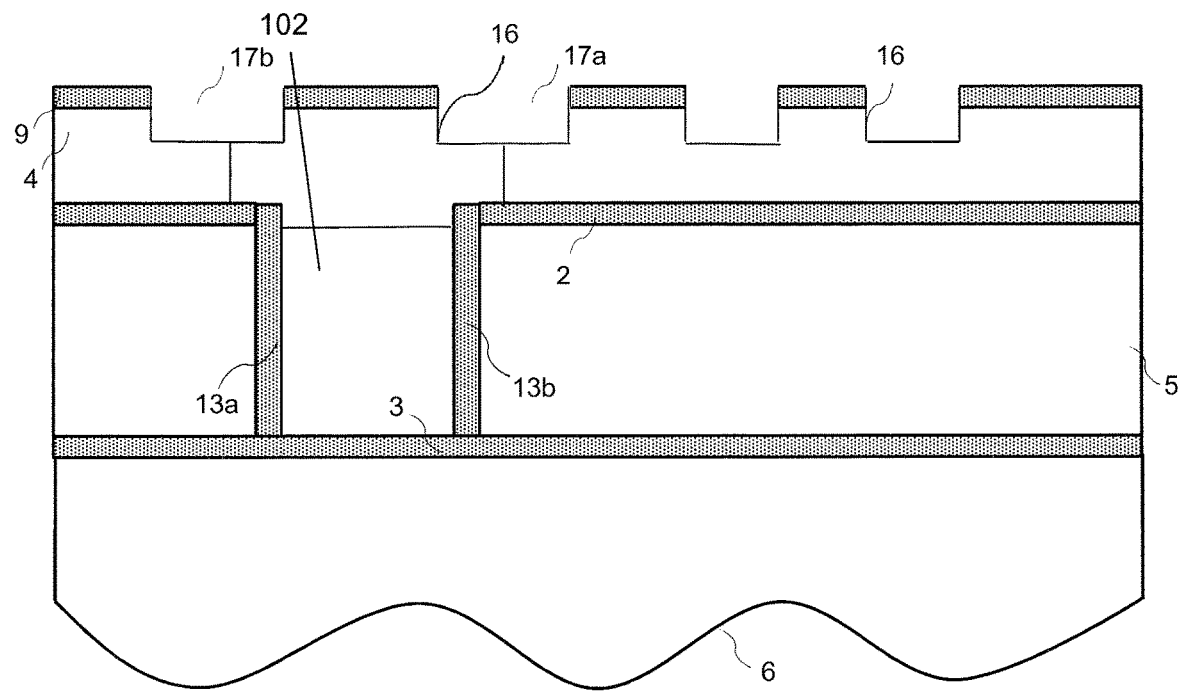
Fig. 6M(i)
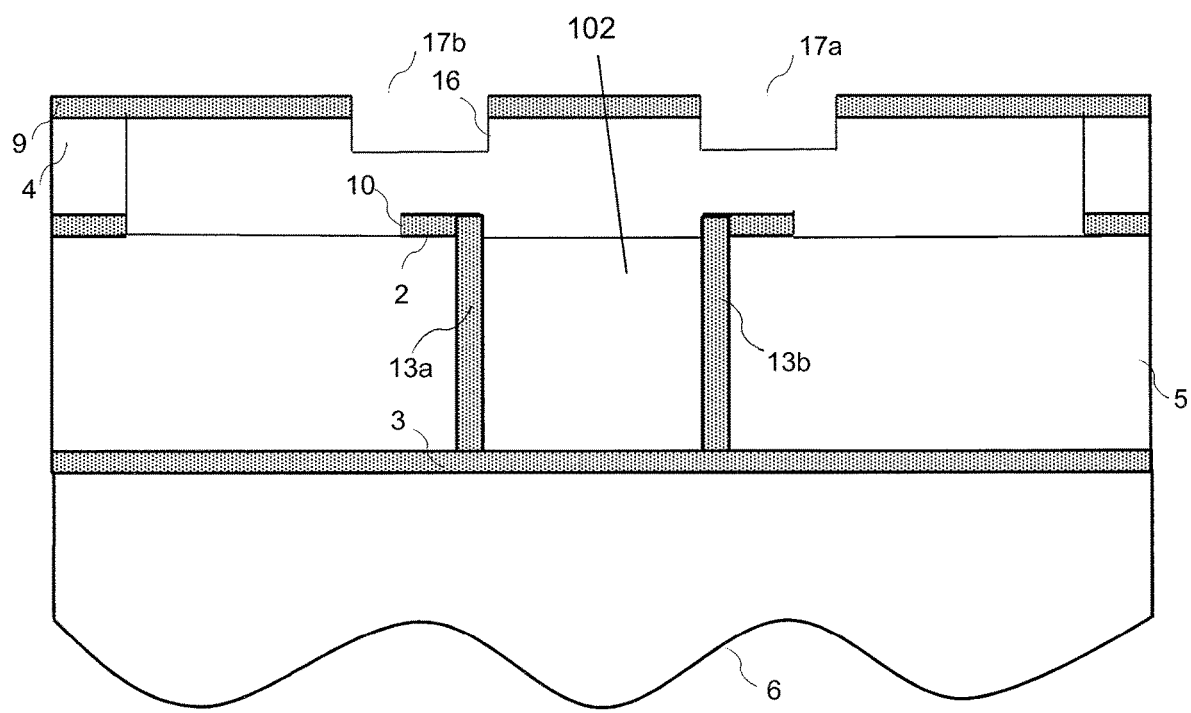
Fig. 6M(ii)

MODE CONVERTER AND METHOD OF FABRICATING THEREOF

CROSS-REFERENCE TO RELATED APPLICATION(S)

This application is a U.S. National Phase patent application and claims priority to and the benefit of International Application Number PCT/GB2017/052065, filed on Jul. 13, 2017, which claims priority to and the benefit of U.S. Provisional Patent Application No. 62/362,012, filed on Jul. 13, 2016, the entire contents of all of which are incorporated herein by reference.

FIELD OF THE INVENTION

The present invention relates to a mode converter and method of fabricating thereof, and particularly mode converters fabricated using, for example, substrates with double silicon on insulator layers.

BACKGROUND

The size of an optical mode within a photonic integrated circuit (PIC) is generally much smaller than the optical mode of a connected fibre optic cable. For example, the optical mode within a fibre optic cable may be around 13 μm×13 μm. Whereas the optical mode within the PIC may be typically a few microns or less. This mismatch in optical mode can lead to coupling losses when connecting the PIC to the fibre optic cable.

Generally increasing the mode size of the optical mode within the PIC is not a viable solution, as the resulting optical circuit would be unfeasibly large.

Known in the prior art are mode converters, which convert the optical mode of the fibre optic cable to that of the optical mode within the PIC (and vice versa). Generally, mode converters in the prior art fall within two categories:
 (1) Converters which involve modified fibre profiles (for example, lensed or tapered fibres) and active alignment to the PIC via fibres mounted in a fibre block.
 (2) Providing a tapered waveguide within the PIC, with integrated v-grooves for passive alignment or fibre attach via a separate fibre block.

Mode converters falling within category (1) generally demand very tight fibre alignment tolerances, and packaging costs can be high due to the increased number of parts and the labour of precise active alignment of the fibre block to the PIC.

Whereas mode converters falling within category (2) generally result in a large variation in the topography of a PIC, due to the relatively large height of the mode converter in contrast to the remaining components on the PIC. This variation in topography can be challenging when it comes to photolithographic processes used in fabrication as it can degrade the dimensional control of the other components on the PIC. The invention aims to provide a manufacturable method of fabricating a low loss, passively aligned PIC without the topography limitations of the prior art.

SUMMARY

At its broadest, the invention provides a method of manufacturing a monolithic optical mode converter using a double silicon-on-insulator structure, where the mode converter is buried relative to an upper surface of the wafer.

In a first aspect, the present invention provides a method of fabricating an optical mode converter from a wafer including a double silicon-on-insulator (DSOI) layer structure, comprising the steps of: providing a first mask over a portion of a device layer of the DSOI layer structure; etching an unmasked portion of the device layer down to at least an upper buried oxide layer, to provide a cavity; etching a first isolation trench and a second isolation trench into a mode converter layer, the mode converter layer being: on an opposite side of the upper buried oxide layer to the device layer and between the upper buried oxide layer and a lower buried oxide layer, the lower buried oxide layer being above a substrate; wherein the first isolation trench and the second isolation trench define a tapered waveguide; filling the first isolation trench and the second isolation trench with an insulating material, so as to optically isolate the tapered waveguide from the remaining mode converter layer; and regrowing the etched region of the device layer.

Advantageously, such a method improves the dimensional tolerances of the device and integrated components. Moreover, the uniformity in the thickness of the device layer (which is high as a result of using a pre-fabricated DSOI wafer) is not compromised by fabrication of the mode converter.

In a second aspect, the present invention provides an optical mode converter, formed on a wafer including a double silicon-on-insulator (DSOI) layer structure, comprising: a substrate, above which is a lower buried oxide layer; a mode converter layer, which is above the lower buried oxide layer, and includes: a tapered waveguide, cladded by an insulator disposed in a first isolation trench and a second isolation trench; and a bulk region, adjacent to the insulator and on an opposing side thereof to the tapered waveguide, formed of a same material as the tapered waveguide; an upper buried oxide layer, which is above the mode converter layer and has a gap therein above the tapered waveguide; and a device layer, which is above the upper buried oxide layer; wherein the device layer includes two etched portions which define a rib waveguide, and an uppermost surface of the rib waveguide is coplanar with an uppermost surface of the device layer.

Optional features of the invention will now be set out. These are applicable singly or in any combination with any aspect of the invention.

The wafer may be a double silicon-in-insulator wafer. The method may include a step of etching a rib waveguide from the regrown region of the device layer.

The step of etching the unmasked portion of the device layer down to at least the upper buried oxide layer may include: a first etching step, etching from an upper surface of the device layer to an upper surface of the upper buried oxide layer; and a second etching step, etching from an upper surface of the upper buried oxide layer to an upper surface of the mode converter layer. The second etching step may include not removing all of the buried oxide in the cavity. For example, a portion of the buried oxide may be retained on opposing sides of the cavity.

The method may further comprise a step, between the steps of etching the unmasked portion and etching the first and second isolation trenches, of: depositing an oxidation barrier over: (i) the first mask and (ii) the cavity, wherein the cavity is defined by sidewalls and a bed. The step of filling the first isolation trench and the second isolation trench may include thermally oxidising the mode converter layer, so as to fill the first isolation trench and the second isolation trench with an oxide.

The method may include a step, after regrowing the etch region of the device layer, of: planarizing the regrown region of the device layer such that it is coplanar with an uppermost surface of the unetched region of the device layer.

The first tapered waveguide may be provided with a first width of between 9 μm and 15 μm and a second width of less than 1 μm.

A width of the cavity etched may be substantially wider than a widest width of the tapered waveguide.

The method may further comprise a step of: etching a v-groove interface at a first end of the mode converter, such that an input facet of the tapered waveguide overhangs the v-groove interface, so as to allow passive alignment of a fibre optical cable to the tapered waveguide. The method may further comprise a step of polishing a first end of the mode converter, so as to provide a planar input facet for active alignment to a fibre optic cable.

The insulator disposed within the first isolation trench and the second isolation trench may be silicon dioxide. The first isolation trench and the second isolation trench may respectively have a width of between 0.4 μm and 1.0 μm.

BRIEF DESCRIPTION OF THE DRAWINGS

Embodiments of the invention will now be described by way of example with reference to the accompanying drawings in which.

DETAILED DESCRIPTION AND FURTHER OPTIONAL FEATURES

Figure 1A:
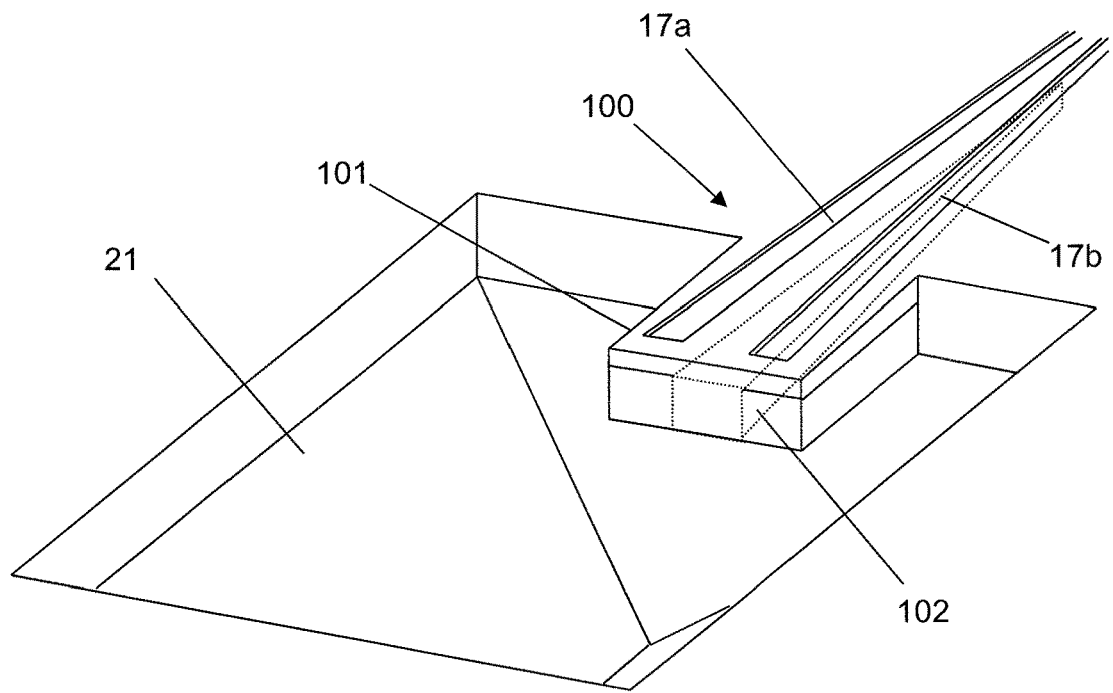
FIGS. 1A and 1B show a mode converter according to the present invention.

FIG. 1A shows a perspective view of a mode converter 100 according to the present invention. In this example, the mode converter is passively connectable to a fibre optic cable via v-groove 21. The v-groove allows a mechanical alignment of a fibre optic cable with an overhanging portion 101 of the mode converter.

Figure 1B:
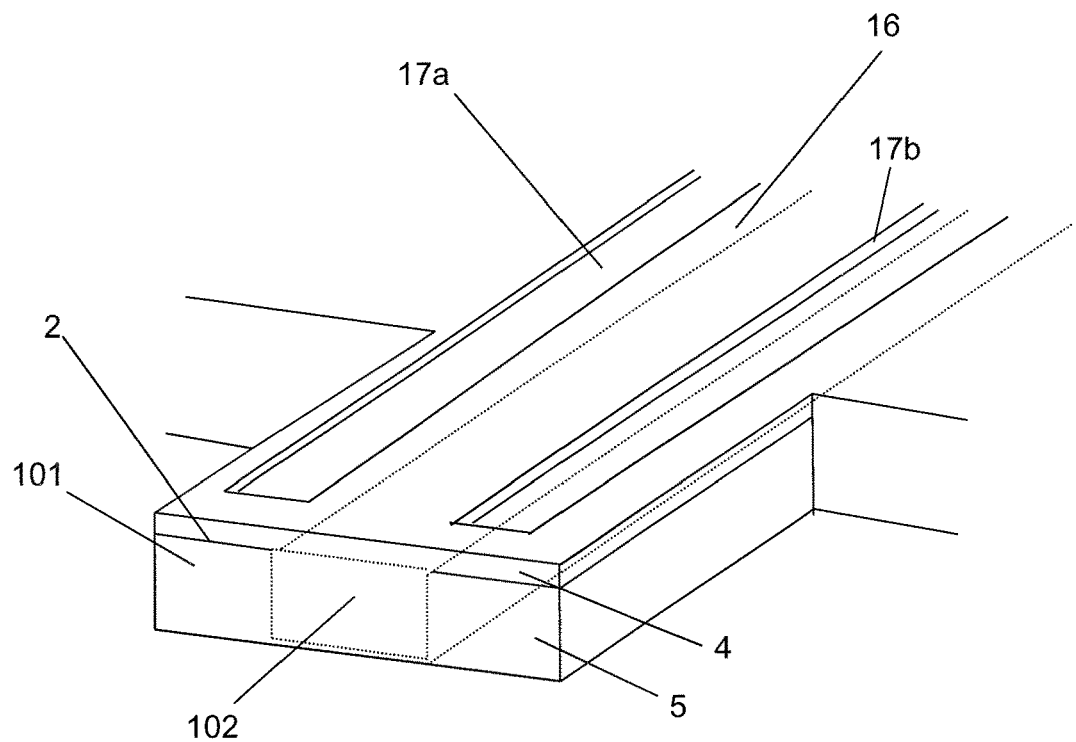

As is shown more clearly in FIG. 1B, the overhanging portion 101 includes a tapered waveguide 102 which tapers horizontally. The tapered waveguide 102 can be described has being generally a triangular prism. The tapered waveguide is disposed within a mode converter layer 5 of the mode converter, above which is a device layer 4. The device layer and mode converter layer are separated by an oxide layer 2. In the device layer is a rib waveguide 16 which is defined by two channels 17a and 17b which have been etched into an uppermost surface of the device layer. The channels are etched to provide a tapering to the rib waveguide, such that it narrows in width along its length. The tapering of both the tapered waveguide 102 and rib waveguide 16 allow the mode converter to convert an optical mode within a fibre optic cable to an optical mode within a photonic integrated circuit. Because the tapered waveguide 102 is positioned below the device layer 4, it may be referred to as a buried tapered waveguide. The length of the tapered waveguide and the rib waveguide can be tuned so as to achieve low loss coupling therebetween.

Figure 2:
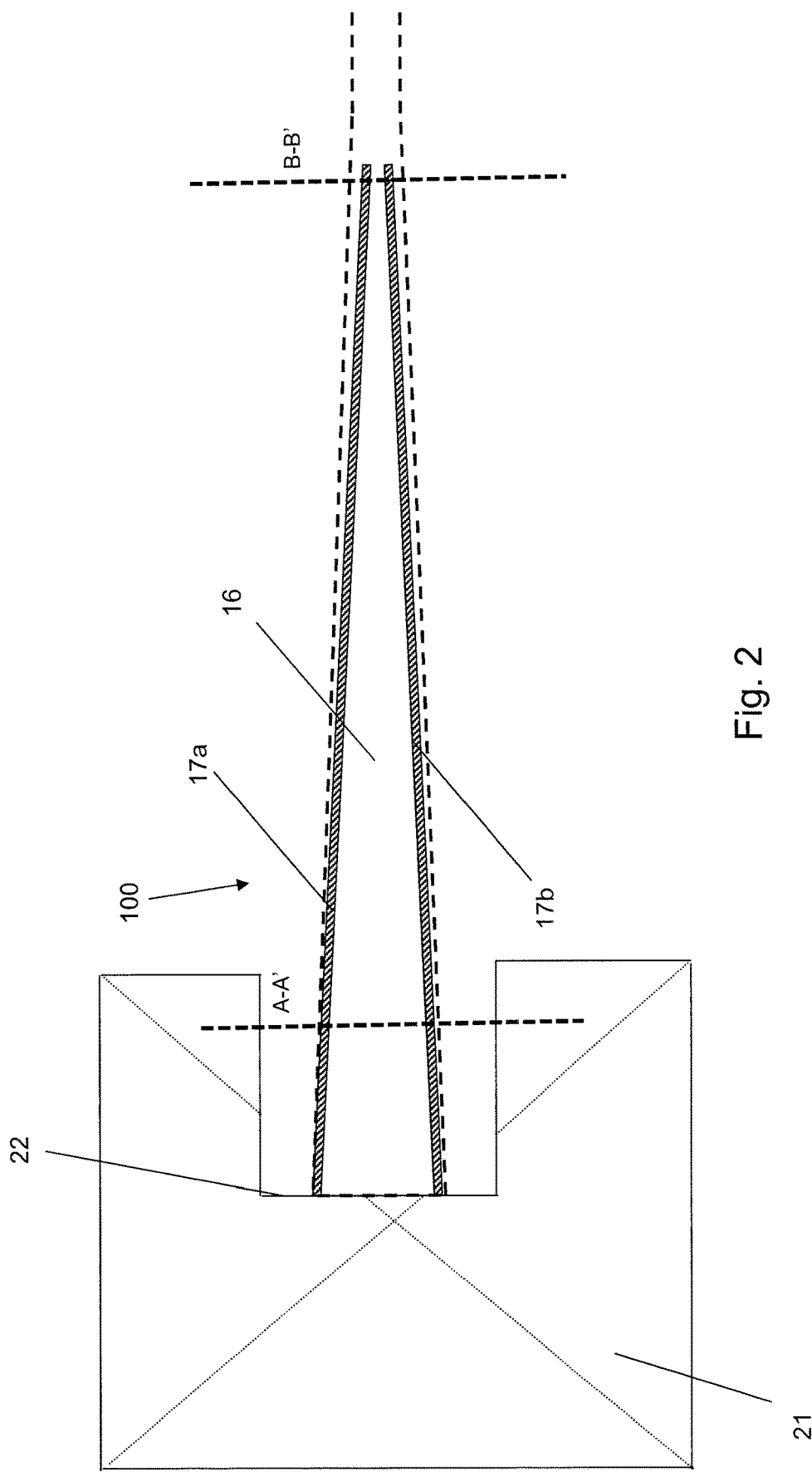
FIG. 2 shows the mode converter of FIGS. 1A and 1B in a top-down plan view.

FIG. 2 is a top-down plan view of the mode converter 100 shown in FIGS. 1A and 1B. Here it can be seen that the rib waveguide 16 (and tapered waveguide 102) extend to an input facet 22 of the mode converter, which overhangs the v-groove 21. The input facet may include an anti-reflective coating, which can further reduce loss. It is also easier to see in this Figure that the channels 17a and 17b (which define the rib waveguide) are angled relative to one another so as to provide a rib waveguide which tapers in length. The overall length of the mode converter 100 is typically within the range of 6-10 mm for a linear taper (i.e. constant taper angle) or even shorter through the use of a non-linear taper design. Two cross-sections are indicated: A-A' and B-B' which are respectively shown in FIGS. 3A and 3B.

Figure 3A:
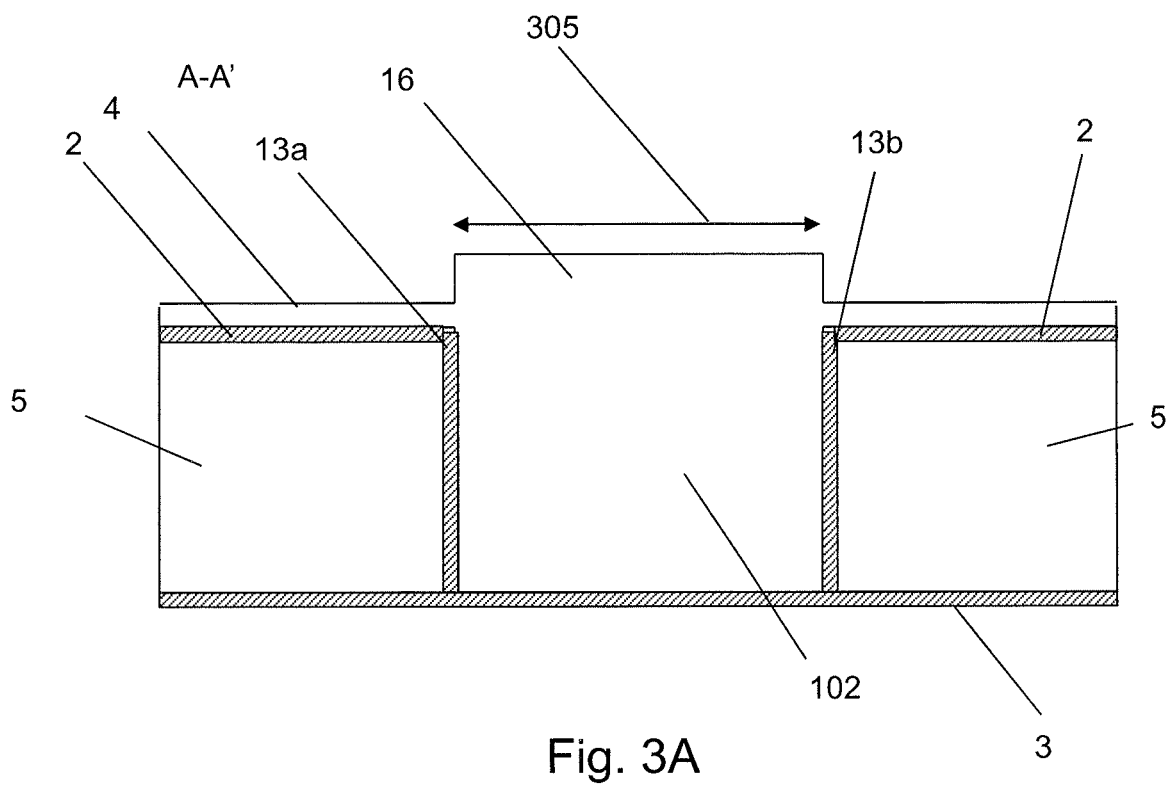
FIGS. 3A and 3B show cross-sections of the mode converter.

FIG. 3A shows the cross-section along A-A'. The mode converter generally comprises a first oxide layer 3, above which is a mode converter layer 5. The mode converter layer 5 is at least partially capped by a second oxide layer 2. The tapered waveguide 102 is defined at least in part by isolation trenches 13a and 13b, which serve to optically isolate the tapered waveguide 102 from the remaining mode converter layer 5. The isolation trenches may be formed from, for example, silicon dioxide. Above the second oxide layer 2 is a device layer 4, at least part of which provides a rib waveguide 16.

Figure 3B:
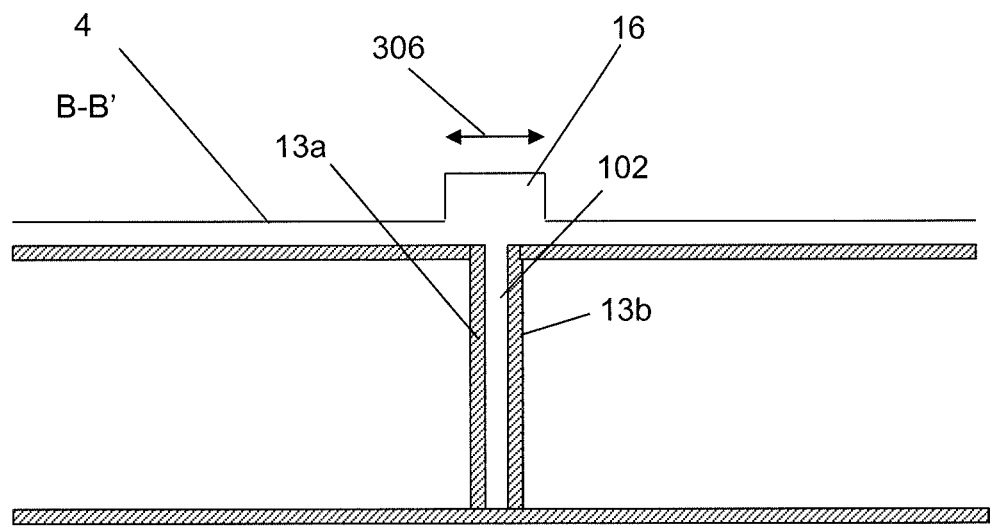

The rib waveguide 16 and tapered waveguide 102, at the location indicated by the cross-section A-A', have a width 305 which partially defines the optical mode. As both waveguides taper in width, at the location indicated by cross-section B-B', as shown in FIG. 3B, they have a width 306 which is narrower than width 305. The width at the input facet 22 may be between 9 μm-15 μm, whereas the width at the end of the mode converter may be around 1 μm or less. In some examples the width of the input facet is 13 μm and the width at the end of the mode converter is 0.3 μm. The length over which the tapered waveguide tapers may be around 3.5 mm. The rib waveguide may have a height, as measured from an upper surface of the second oxide layer 2, of between 1 μm and 5 μm. The tapered waveguide 102 may have a height, as measured between the first oxide layer 3 and second oxide layer 2, of between 7 μm and 12 μm.

Figure 4:
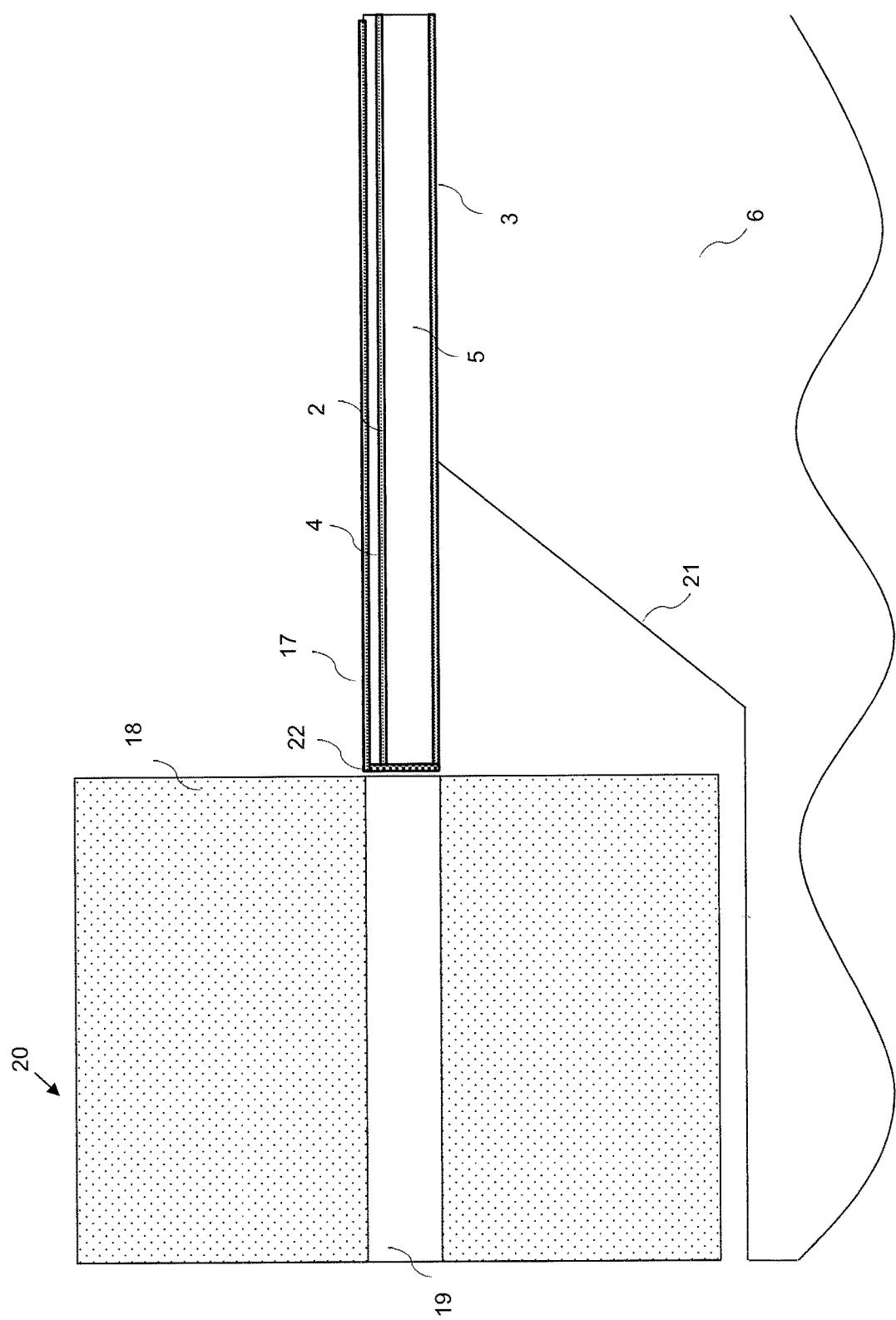
FIG. 4 shows a cross-section of the mode converter as connected to a fibre optic cable.

FIG. 4 shows the mode converter 100 as connected to a fibre optic cable 20. The fibre optic cable 20 sits within the v-groove, with its outer cladding 18 abutting the floor of the v-groove. The inner core 19 of the fibre optic cable is thereby aligned with the input facet 22 of the mode converter, such that light can pass from the inner core into the tapered waveguide 102 and rib waveguide 106 with relatively little loss. This form of alignment is known as passive alignment, as the structure of the devices allows mechanical alignment of the inner core 18 and input facet 22.

Figure 5:
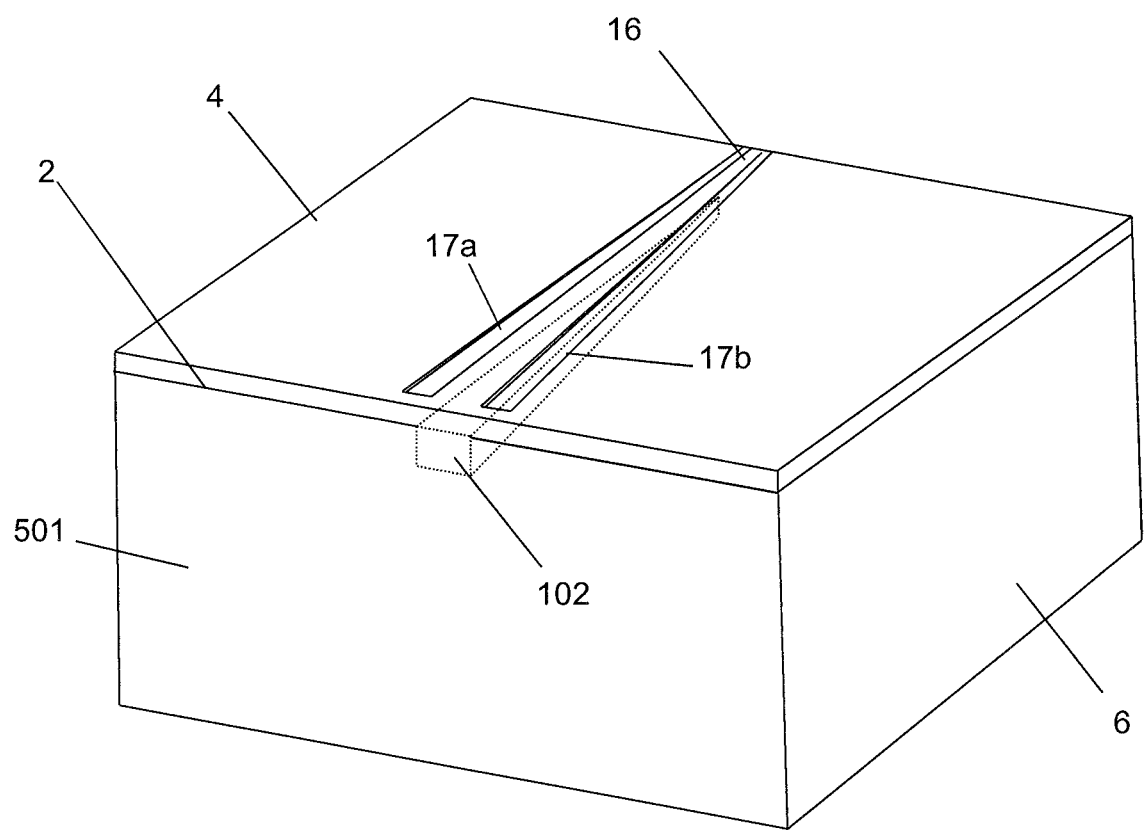
FIG. 5 shows a variant mode converter.

In contrast, FIG. 5 shows a variant mode converter which utilizes active alignment. Active alignment is the process of providing an optical signal into the mode converter from a fibre optical cable, measuring the loss in the optical signal as a function of position, and calibrating the position of the fibre relative to the mode converter so as to minimise the loss in the optical signal.

Therefore, as shown in FIG. 5, a generally planar surface 501 is provided so as to allow maximum flexibility in active alignment. The tapered waveguide 102 can be displaced both horizontally and vertically relative to a connecting fibre optic cable.

Figure 6A:
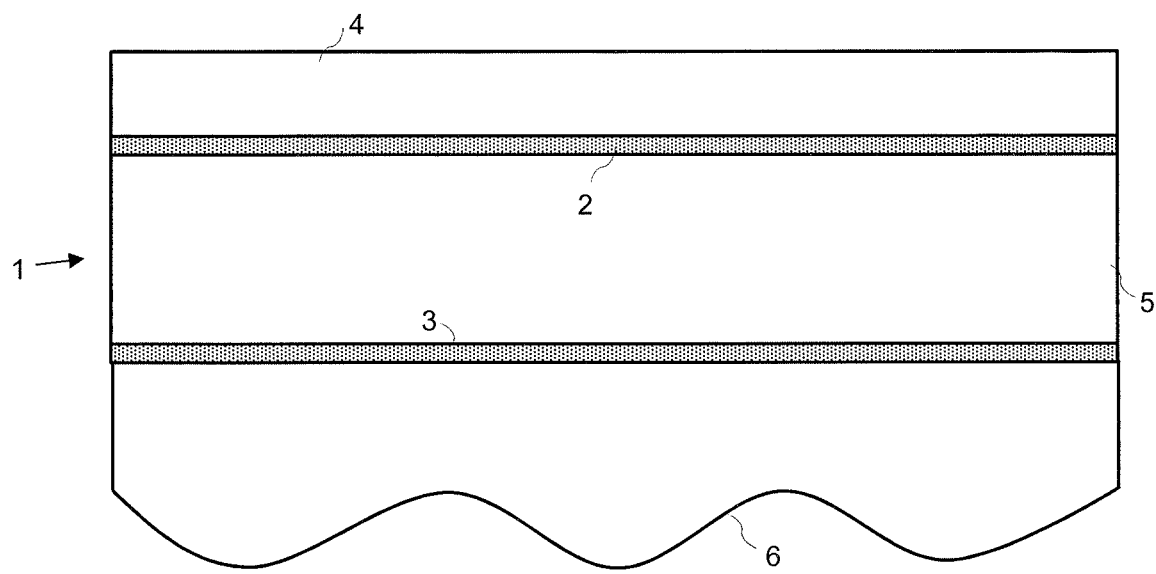
FIGS. 6A-6N show various manufacturing stages of the mode converter of the previous figures.
Figure 6B:
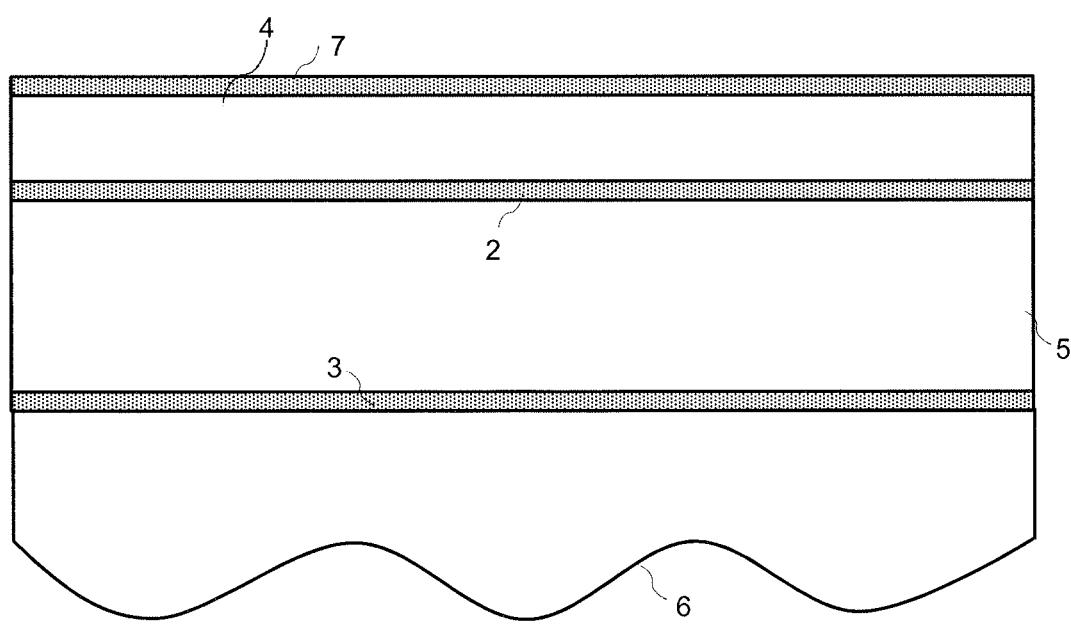
Figure 6C:
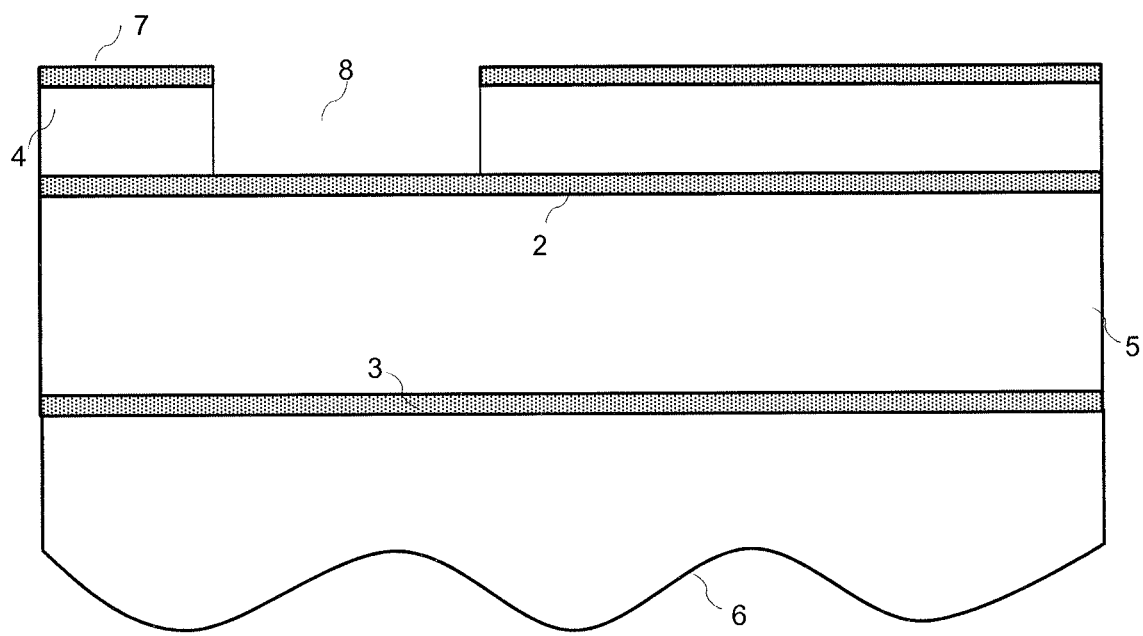
Figure 6D:
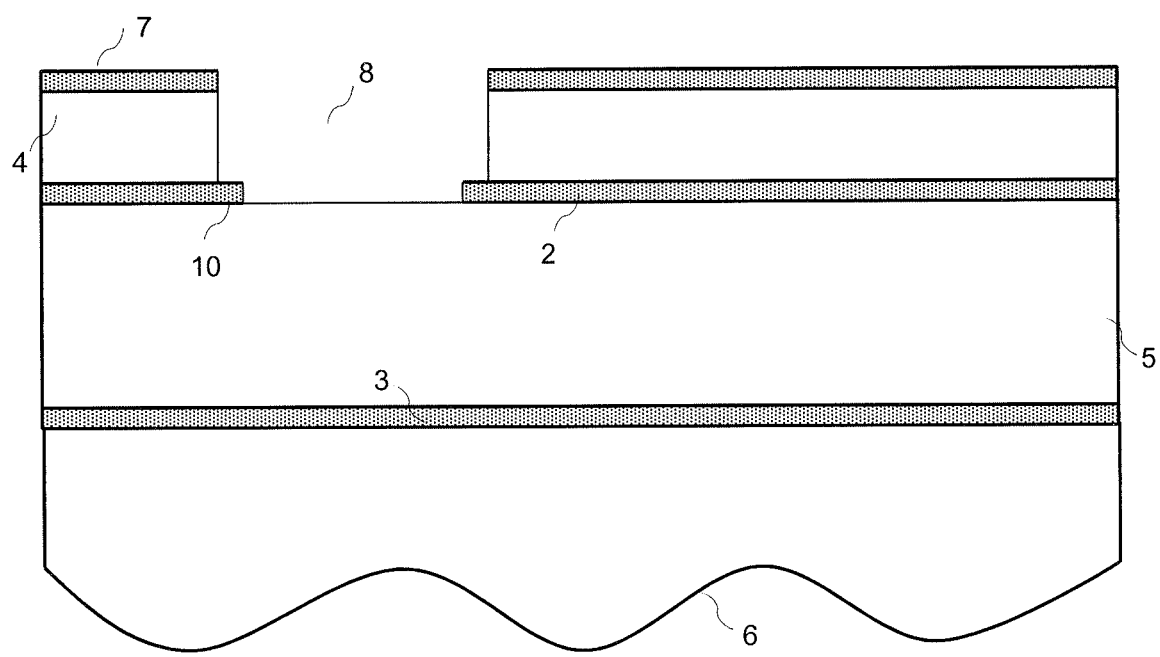
Figure 6E:
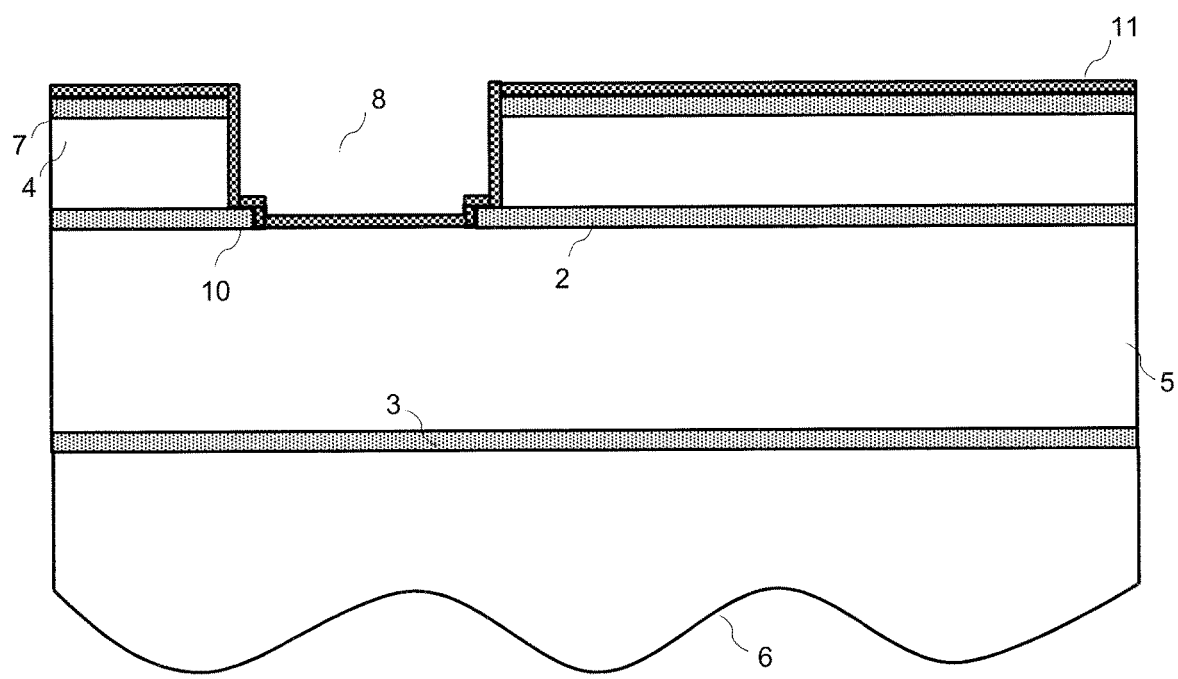
Figure 6F:
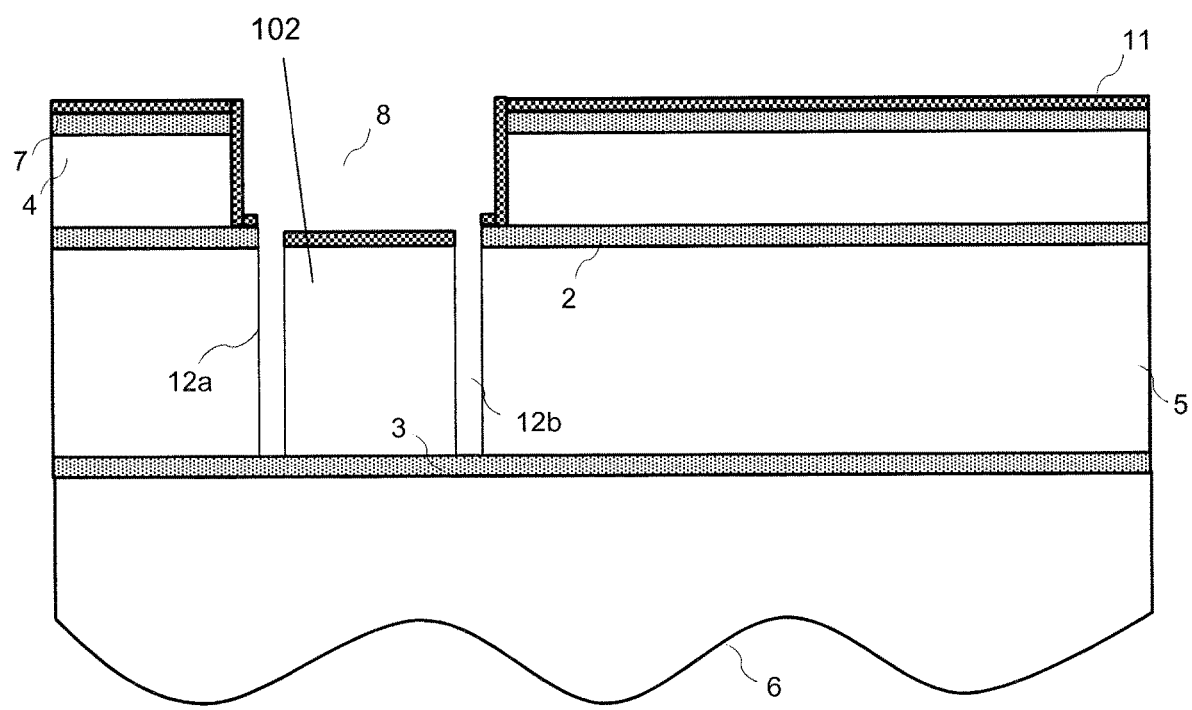
Figure 6G:
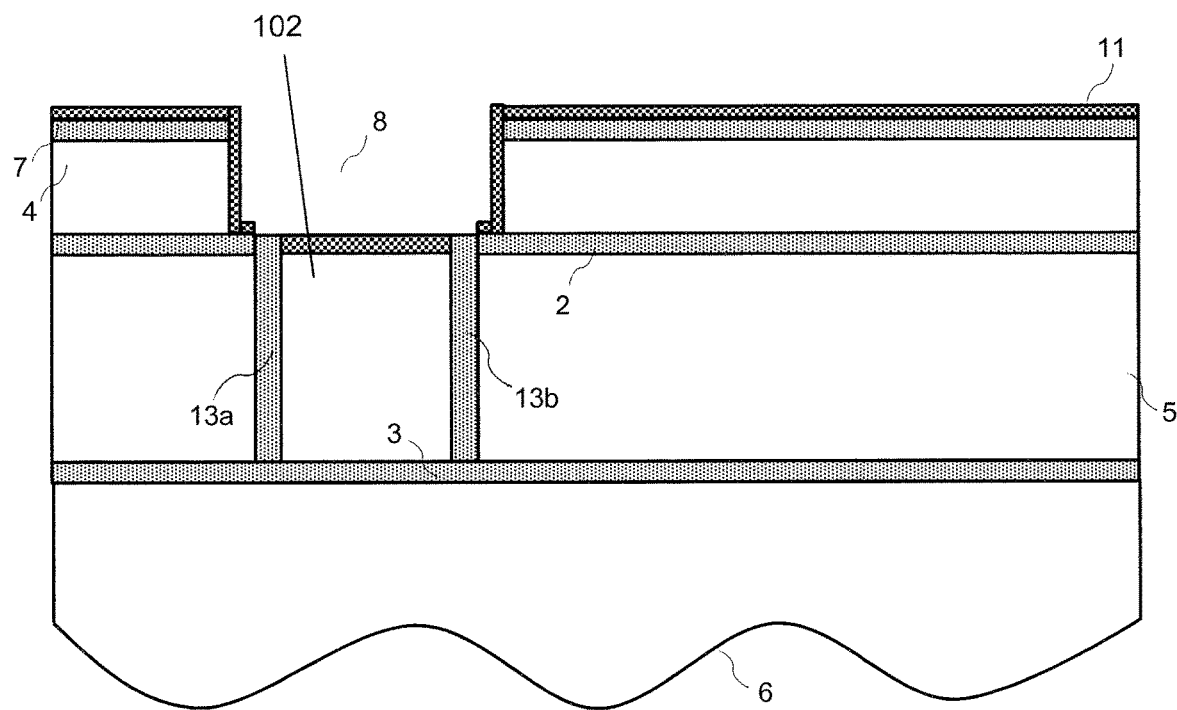
Figure 6H:
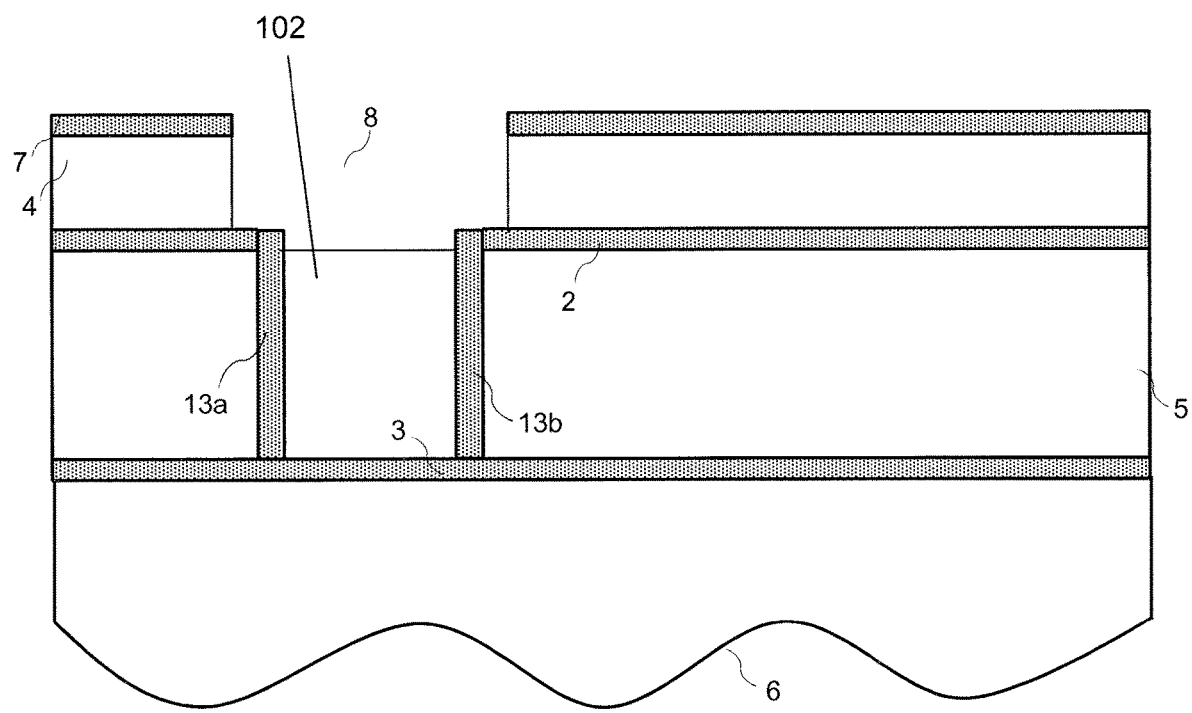
Figure 6I:
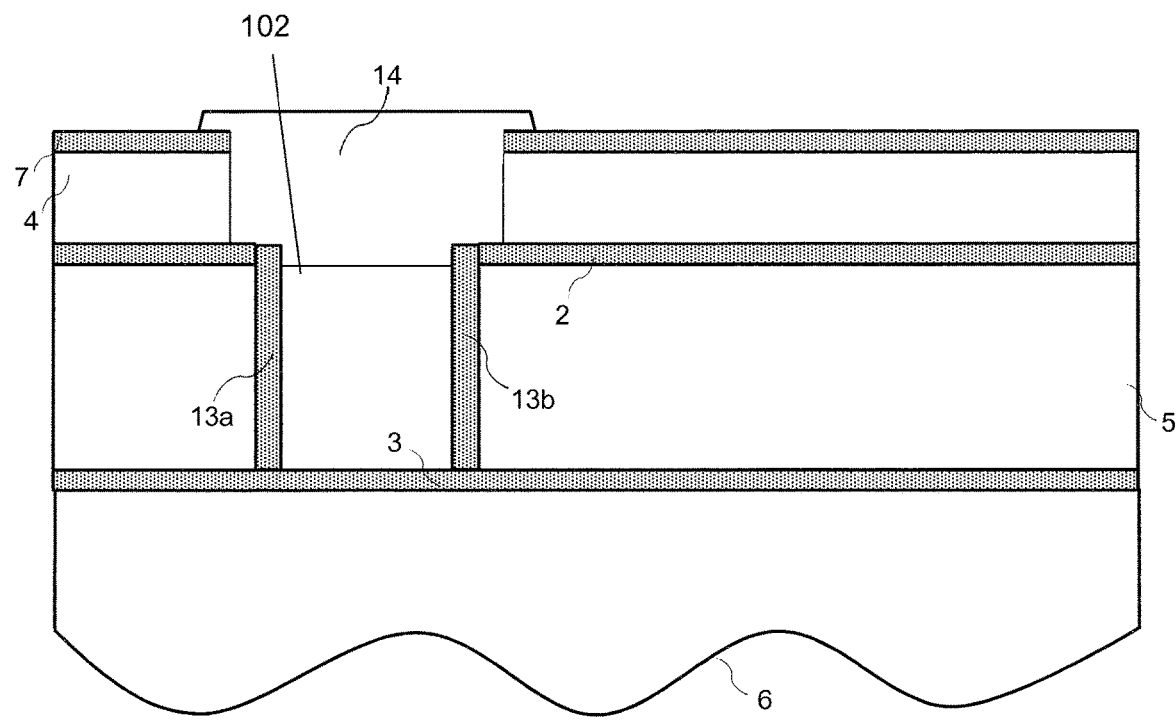
Figure 6J:
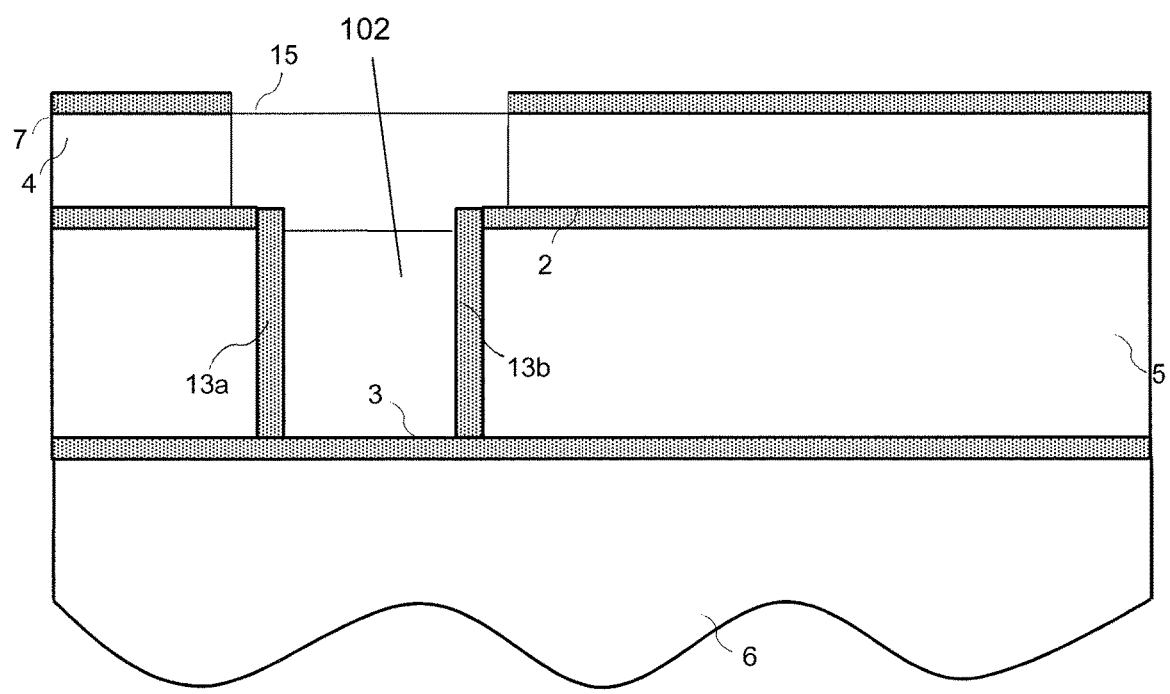
Figure 6K:
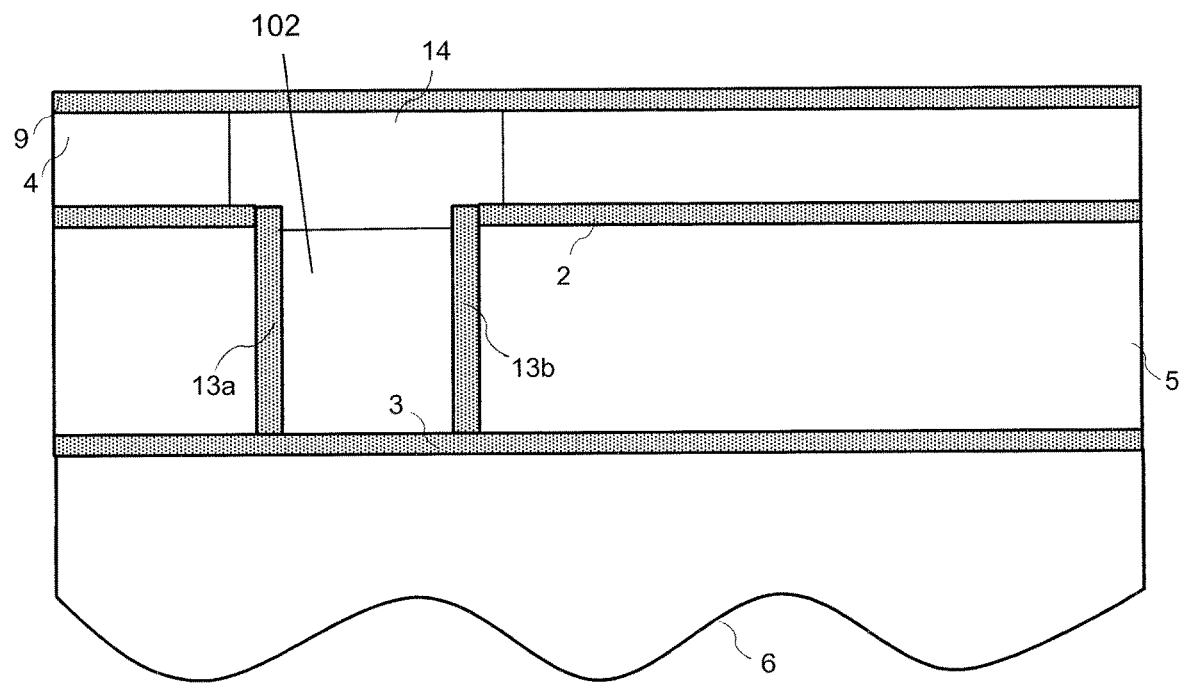
Figure 6L:
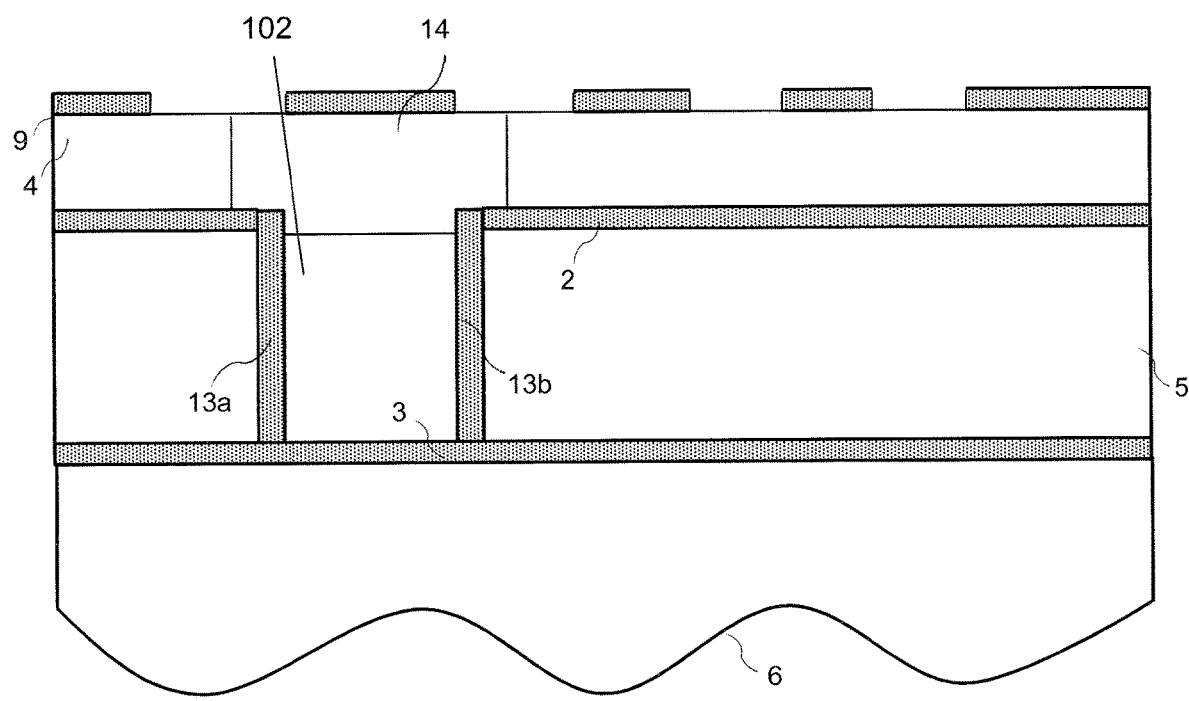
Figure 6N:
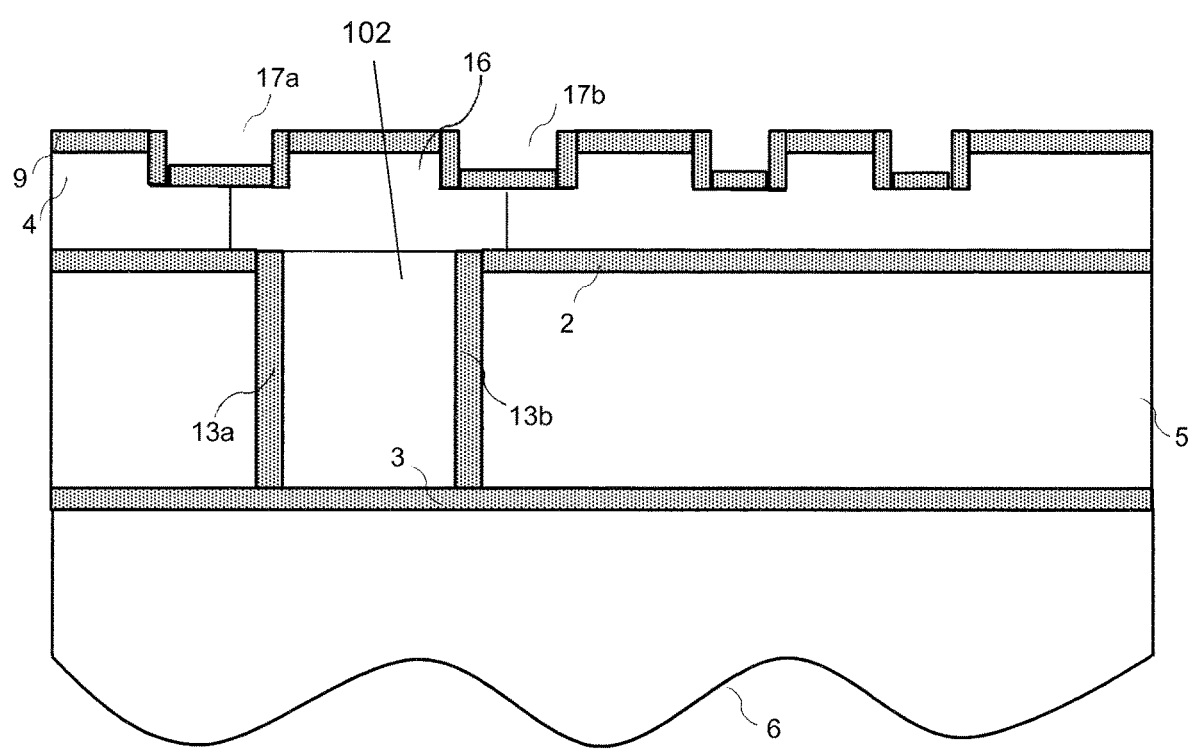

FIGS. 6A-6N show the various manufacturing stages for a mode converter 100 as described above.

In a first step, a wafer 1 is provided which includes a double silicon-on-insulator (DSOI) layer structure, as shown in FIG. 6A. The wafer comprises a substrate 6, for example a silicon handle wafer, above which is a first or lower buried oxide layer 3. Above the first buried oxide layer 3 is a mode converter layer 5, which extends upwards (i.e. away from substrate 6) to meet a second buried oxide layer 2. Above the second buried oxide layer 2 (i.e. on a side opposite to the mode converter layer 5) is a device layer 4. The device layer 4 and mode converter layer 5 may be formed of silicon. The first and second buried oxide layers may be formed of silicon dioxide. The mode converter layer may be between 7 µm and 12 µm, in some examples it is 9.85 µm tall (as measured from the top of the first buried oxide layer 3 to the bottom of the second buried oxide layer 2). The first and second buried oxide layers may be between 0.3 µm and 1 µm thick, in some examples they are 0.4 µm thick. The buried oxide layers should optically isolate the mode converter layer 5 from both the device layer 4 (except where the oxide has been removed) and the substrate 6. The device layer is generally between 1 µm and 5 µm thick, and in some examples is 3 µm thick. The substrate 6 may be either 725 µm or 675 µm thick, depending on the diameter of the wafer (either 200 mm or 150 mm).

In a next step, shown in FIG. 6B, a hard mask layer 7 is disposed over the device layer 4. The hard mask layer may be a thermally grown silicon dioxide layer grown from a silicon device layer 4. The hard mask is a sacrificial layer that may be removed later in the processing steps. It functions as an effective etch mask and protection layer for device layer 4. Accordingly it should be sufficiently thick, for example 300 nm as measured from the top of the device layer to the top of the hard mask 7.

In FIG. 6C, the hard mask 7 has been patterned using photolithography and then etched down along with a portion of the device layer 4 to remove the silicon in areas of the wafer surface where the tapered waveguide will be fabricated. A cavity 8 results in the device layer. A dry etch technique is preferred to maintain good dimensional control of the etched features.

A further processing step is shown in FIG. 6D. The upper or second buried oxide layer 2 is patterned and etched within the cavity 8. The width 10 of the buried oxide region within the cavity is optimised to improve lithography in the bottom of the cavity 8, and to provide optical isolation of the rib waveguide portion in the device layer 4. Next, as shown in FIG. 6E, an oxidation barrier 11 is deposited over the device. The oxidation barrier is preferably deposited using a low pressure chemical vapour deposition (LPCVD) technique with a barrier thickness of below 200 nm so as to prevent excessive stress on the substrate.

In FIG. 6F, the oxidation barrier 11 and upper or second buried oxide layer 2 are patterned using photolithography. The mode converter layer 5 is then etched to an upper surface of the buried oxide layer 3, thereby forming narrow trenches 12a and 12b which optically isolate the tapered waveguide 102. The trenches 12a and 12b are angled relative to each other along their length (in a direction into the plane of FIG. 6F) such that the distance between them varies with length. The narrow end of the tapered waveguide is generally designed so as to have a width of less than 0.5 µm (as measured between the trenches 12a and 12b), as this helps to provide low loss coupling the rib waveguide 16 in the device layer 4. The width of the isolation trenches 12a and 12b (as measured in a direction horizontally across the substrate 6) should be minimised (and is typically within the range 0.4 µm-1.0 µm) whilst still providing the necessary optical isolation.

FIG. 6G shows a subsequent step, where the isolation trenches 12a and 12b have been filled to become tapered waveguide cladding 13a and 13b. This may be achieved by thermally oxidising the substrate 6, such that the cladding is formed of silicon dioxide. The oxidation barrier 11 prevents any oxidation of the surface, and so the thickness of the device layer 4 is not affected by this step. Advantageously, this means that the tightly controlled uniformity of this later is preserved. The oxidation barrier 11 is then removed, for example by using a wet chemical etchant such as phosphoric acid (because this does not etch the underlying silicon dioxide 7 or silicon 4) resulting in a device as shown in FIG. 6H. Next, the device layer 4 is regrown in the cavity 8 as shown in FIG. 6I. When the device layer 4 is made of silicon, a selective silicon epitaxial process is used. Such a process only grows silicon on silicon surfaces, and so there is no growth on the oxide layer 7. The regrowth process results in an overgrown region 14 above the oxide layer 7. Therefore, as shown in FIG. 6J, the regrown region 14 is planarized to provide a regrown region 15 which matches the original surface height of the device layer 4. The planarization may be performed by a chemical mechanical polishing process.

In a subsequent step, as shown in FIG. 6K, the previous hard mask 7 is removed (for example using a wet chemical etchant such as hydrofluoric acid) and a new hard mask 9 is provided. The new hard mask may be thermally grown (and so would be an oxide mask) or may be deposited. The uppermost surface of the device is now generally planar, and so it will be appreciated that photonics elements of the integrated photonic circuit subsequently fabricated in the device layer 4 are not compromised by the presence of the mode converter 100 (in contrast to the prior art approaches).

FIG. 6L shows a next fabrication step, where the hard mask 9 is patterned using photolithography and then etched, preferably using a dry etch process to maintain good dimension tolerances. After this step the device layer 4 is etched to fabricate a rib waveguide 16 which is aligned to the tapered waveguide 102 in the mode converter layer 5. The rib waveguide 16 is generally defined by the production of two channels 17a and 17b as discussed above. The result is shown in FIG. 6M(i).

It will be appreciated by those skilled in the art of silicon photonic circuits that a wide variety of photonic elements can now be fabricated in the device layer connected via the rib waveguide 16 to the tapered waveguide 102 for low loss coupling from a photonic integrated circuit to a fibre optic cable (and vice versa).

An alternative example is shown in FIG. 6M(ii), where the cavity 8 etched in FIG. 6C is made significantly wider than the tapered waveguide 102 width. The width 10 of the oxide isolation region is typically a few microns wide so as to ensure that the rib waveguide 16 is optically isolated from the mode converter layer 5. Advantageously, the photoresist is more uniform at the bottom of the cavity 8 in the region of the tapered waveguide. This allows better dimensional control. Also, the wide cavity is not tapered but remains a constant width, which can be beneficial during the planarization process. For example, it has been found that during chemical mechanical polishing the polishing rate varies with cavity width.

FIG. 6N shows a final processing step for the mode converter 100 where a cladding layer is grown or deposited on top of the wafer, to act as a hard mask for downstream processing steps and to provide passivation and protection for the photonic integrated circuit. It will be appreciated to those skilled in the art, that a wide range of passive photonic elements including (but not limited to) multiplexors, de-multiplexors, and other wavelength selective devices may be fabricated in the device layer. Likewise, the addition of further downstream process modules such as doping, contacts, and metallisation allows the realisation of active photonic devices such as switches, p-i-n diodes, and modulators.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

All references referred to above are hereby incorporated by reference.

LIST OF FEATURES

1 Wafer
2 Buried oxide layer
3 Buried oxide layer
4 Device layer
5 Mode converter layer
6 Substrate
7 Oxide layer
8 Cavity in device layer
9 New oxide layer
10 Oxide isolation region
11 Oxidation barrier
12a, 12b Isolation trenches
13a, 13b Tapered waveguide cladding
14 Overgrown region
15 Regrown region
16 Rib waveguide
17a, 17b First and second channels
18 Fibre optic cable cladding
19 Fibre optic cable core
20 Fibre optic cable
21 V-groove
22 Input facet
100 Mode converter
101 Overhanging portion
102 Tapered waveguide
305 First tapered waveguide width
306 Second tapered waveguide width
602 Dry etched facet
701 Height of rib waveguide
702 Height of device layer

The invention claimed is:

1. A method of fabricating an optical mode converter from a wafer including a double silicon-on-insulator (DSOI) layer structure, comprising the steps of:
   providing a first mask over a portion of a device layer of the DSOI layer structure;
   etching an unmasked portion of the device layer down to at least an upper buried oxide layer, to provide a cavity;
   etching, after the etching of the unmasked portion of the device layer, a first isolation trench and a second isolation trench into a mode converter layer, the mode converter layer being:
     on an opposite side of the upper buried oxide layer from the device layer and between the upper buried oxide layer and a lower buried oxide layer, the lower buried oxide layer being above a substrate;
   wherein the first isolation trench and the second isolation trench define a tapered waveguide;
   filling the first isolation trench and the second isolation trench with an insulating material, so as to optically isolate the tapered waveguide from the remaining mode converter layer; and
   regrowing the etched region of the device layer.

2. The method of claim 1, further comprising a step of:
   etching a rib waveguide from the regrown region of the device layer.

3. The method of claim 1, wherein the step of etching the unmasked portion of the device layer down to at least the upper buried oxide layer comprises:
   a first etching step, etching from an upper surface of the device layer to an upper surface of the upper buried oxide layer; and
   a second etching step, etching from an upper surface of the upper buried oxide layer to an upper surface of the mode converter layer.

4. The method of claim 3, wherein the second etching step does not remove all of the buried oxide layer in the cavity.

5. The method of claim 1, further comprising a step, between the steps of etching the unmasked portion and etching the first and second isolation trenches, of:
   depositing an oxidation barrier over: (i) the first mask and (ii) the cavity, wherein the cavity is defined by sidewalls and a bed.

6. The method of claim 5, wherein the step of filling the first isolation trench and the second isolation trench comprises:
   thermally oxidizing the mode converter layer, so as to fill the first isolation trench and the second isolation trench with an oxide.

7. The method of claim 1, further comprising a step, after regrowing the etched region of the device layer, of:
   planarizing the regrown region of the device layer such that it is coplanar with an uppermost surface of the unetched region of the device layer.

8. The method of claim 1, wherein the tapered waveguide is provided with a first width of between 9 µm and 15 µm and a second width of less than 1 µm.

9. The method of claim 1, wherein a width of the cavity etched is substantially wider than a widest width of the tapered waveguide.

10. The method of claim 1, further comprising a step of:
    etching a v-groove interface at a first end of the mode converter, such that an input facet of the tapered waveguide overhangs the v-groove interface, so as to allow passive alignment of a fiber optical cable to the tapered waveguide.

11. The method of claim 1, further comprising a step of:
    polishing a first end of the tapered waveguide, so as to provide a planar input facet for active alignment to a fiber optic cable.

12. A method of fabricating an optical mode converter from a wafer including a double silicon-on-insulator (DSOI) layer structure, comprising the steps of:
    providing a first mask over a portion of a device layer of the DSOI layer structure;
    etching an unmasked portion of the device layer from an upper surface of the device layer to an upper surface of an upper buried oxide layer, to provide a cavity;
    etching from an upper surface of the upper buried oxide layer in the cavity to an upper surface of the mode converter layer, wherein the etching does not remove all of the upper buried oxide layer in the cavity;

etching a first isolation trench and a second isolation trench into a mode converter layer, the mode converter layer being on an opposite side of the upper buried oxide layer from the device layer and between the upper buried oxide layer and a lower buried oxide layer, the lower buried oxide layer being above a substrate;

wherein the first isolation trench and the second isolation trench define a tapered waveguide;

filling the first isolation trench and the second isolation trench with an insulating material, so as to optically isolate the tapered waveguide from the remaining mode converter layer; and regrowing the etched region of the device layer.

13. The method of claim 12, further comprising a step of:
etching a rib waveguide from the regrown region of the device layer.

14. The method of claim 12, further comprising a step, between the steps of etching an unmasked portion of the device layer and etching the first and second isolation trenches, of:
depositing an oxidation barrier over: (i) the first mask and (ii) the cavity, wherein the cavity is defined by sidewalls and a bed.

15. The method of claim 14, wherein the step of filling the first isolation trench and the second isolation trench comprises:
thermally oxidizing the mode converter layer, so as to fill the first isolation trench and the second isolation trench with an oxide.

16. The method of claim 12, further comprising a step, after regrowing the etched region of the device layer, of:
planarizing the regrown region of the device layer such that it is coplanar with an uppermost surface of the unetched region of the device layer.

17. The method of claim 12, wherein the tapered waveguide is provided with a first width of between 9 μm and 15 μm and a second width of less than 1 μm.

18. The method of claim 12, wherein a width of the cavity etched in the device layer is substantially wider than a widest width of the tapered waveguide.

19. The method of claim 12, further comprising a step of:
etching a v-groove interface at a first end of the mode converter, such that an input facet of the tapered waveguide overhangs the v-groove interface, so as to allow passive alignment of a fiber optical cable to the tapered waveguide.

20. The method of claim 12, further comprising a step of:
polishing a first end of the tapered waveguide, so as to provide a planar input facet for active alignment to a fiber optic cable.

* * * * *